(12) United States Patent
Hwang et al.

(10) Patent No.: US 9,837,992 B2
(45) Date of Patent: Dec. 5, 2017

(54) SEMICONDUCTOR DEVICE

(71) Applicants: Hyun-Chul Hwang, Suwon-si (KR); Min-Su Kim, Hwaseong-si (KR)

(72) Inventors: Hyun-Chul Hwang, Suwon-si (KR); Min-Su Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/077,438

(22) Filed: Mar. 22, 2016

(65) Prior Publication Data

US 2016/0285435 A1 Sep. 29, 2016

(30) Foreign Application Priority Data

Mar. 25, 2015 (KR) .................. 10-2015-0041267

(51) Int. Cl.
*H03K 3/289* (2006.01)
*H03K 3/012* (2006.01)
*H03K 3/356* (2006.01)

(52) U.S. Cl.
CPC ....... *H03K 3/012* (2013.01); *H03K 3/356191* (2013.01)

(58) Field of Classification Search
None
See application file for complete search history.

(56) References Cited

U.S. PATENT DOCUMENTS

| | | | |
|---|---|---|---|
| 6,822,495 B2 | 11/2004 | Larsson et al. | |
| 6,977,528 B2 | 12/2005 | Kang et al. | |
| 7,292,672 B2 * | 11/2007 | Isono | G11C 7/106 |
| | | | 327/202 |
| 2013/0147534 A1 * | 6/2013 | Cheng | H03K 3/35625 |
| | | | 327/202 |
| 2014/0070861 A1 | 3/2014 | Fujita | |
| 2015/0207494 A1 * | 7/2015 | Kim | H03K 3/356139 |
| | | | 327/218 |

FOREIGN PATENT DOCUMENTS

| | | |
|---|---|---|
| JP | 4122970 A | 7/2004 |
| JP | 4589496 | 9/2010 |
| KR | 2003-0010246 A | 2/2003 |
| KR | 0376915 A | 3/2003 |
| KR | 0473386 | 2/2005 |
| KR | 0667041 B1 | 1/2007 |
| KR | 2009-0080338 A | 7/2009 |

* cited by examiner

*Primary Examiner* — Long Nguyen
(74) *Attorney, Agent, or Firm* — Volentine & Whitt, PLLC

(57) ABSTRACT

A semiconductor circuit includes a first circuit determining a voltage of a first node in response to the clock signal and the input data signal, a first latch determining a voltage of a second node in response to the clock signal and the voltage of the first node, and a second circuit determining a voltage of a third node in response to the clock signal and the voltage of the second node. The output data signal is provided in response to the voltage of the third node, the clock signal controls a flip-flop operation with respect to the input data signal and the output data signal, and respective voltages are maintained constant at the first node, second node and third node regardless of level transitions in the clock signal so long as a level of the input data signal is maintained constant.

21 Claims, 15 Drawing Sheets

1200

1300

1400

SEMICONDUCTOR DEVICE

This application claims priority from Korean Patent Application No. 10-2015-0041267 filed on Mar. 25, 2015, the subject matter of which is hereby incorporated by reference.

BACKGROUND

The inventive concept relates generally to semiconductor circuits. More particularly, the inventive concept relates to semiconductor circuits that receive an input data signal, perform a flip-flop type operation in response to a clock signal, and provide a data output signal.

With process miniaturization, more logic circuits are being integrated onto a single chip. Accordingly, power consumption per unit area is gradually increasing. For this reason, heat is becoming an important issue in electronic devices employing this chip.

A flip-flop and a clock gate which supplies a clock signal to the flip-flop are significant elements that consume notable power in many electronic devices. Therefore, it is very important to reduce, wherever reasonably possible, the power consumption of such elements.

SUMMARY

Certain embodiments of the inventive concept provide semiconductor circuits having improved product reliability and reduced power consumption. However, the beneficial aspects of the inventive concept are not restricted to only these features or only the features described herein. The above and other aspects of the inventive concept will become more apparent to one of ordinary skill in the art to which the inventive concept pertains by referencing the detailed description given below.

According to an aspect of the inventive concept, there is provided a semiconductor circuit including a first circuit that determines a voltage of a first node in response to an input data signal and a clock signal, a first latch that determines a voltage of a second node in response to the voltage of the first node and the clock signal, a second latch that determines a voltage of a third node in response to the voltage of the second node and the clock signal, and a second circuit that provides an output data signal in response to the voltage of the third node and the clock signal. The first circuit includes a first transistor of first type (P1) connected to a power supply voltage and gated by the input data signal, a first transistor of second type (N1) connected between ground and the first node and gated by the input data signal, and a second transistor of first type (P2) connected between P1 and the first node and gated by the clock signal to control the output of P1 with respect to the first node. The first latch includes a fourth transistor of first type (P4) gated by the voltage of the first node and pulling up the voltage of the second node, a fifth transistor of first type (P5) connected between the power supply voltage and P4 and gated by the clock signal, a fourth transistor of second type (N4) connected in series with P4, gated by the voltage of the first node, and pulling down the voltage of the second node, and a third transistor of second type (N3) connected between N4 and ground and gated by the clock signal.

According to another aspect of the inventive concept, there is provided a semiconductor including; a first circuit including a first transistor of first type (P1) gated by an input data signal to control a connection in the first circuit to a power supply voltage, a second transistor of first type (P2) gated by a clock signal to control the output of P1 with respect to a first node, and a first transistor of second type (N1) gated by the input data signal to control a connection in the first circuit to ground, a first latch including a fifth transistor of first type (P5) gated by the clock signal to control a connection in the first latch to the power supply voltage, a fourth transistor of first type (P4) gated by the voltage of the first node to control an output of P5 to a second node, a series combination of a third transistor of second type (N3) and a fourth transistor of second type (N4) connected between the second node and ground, wherein N3 is gated by the clock signal and N4 is gated by the voltage of the first node to control an output of N3 to the second node, a second latch including a transistor of first type gated by the voltage of the second node to control a connection between the power supply voltage and a third node, and a transistor of second type gated by an inverted version of the voltage of the first node to control a connection between the third node and ground, and a second circuit that outputs an output data signal in response to a voltage level of the third node and the clock signal.

According to another aspect of the inventive concept, there is provided a semiconductor circuit including; a first circuit that determines a voltage of a first node in response to an input data signal and a clock signal, a first latch that determines a voltage of a second node in response to the voltage of the first node and the clock signal, and a second latch that determines a voltage of a third node in response to the voltage of the second node and the clock signal. The first latch includes a first transistor, a second transistor, a third transistor and a fourth transistor, wherein the first transistor is gated by the clock signal to provide a power supply voltage, the second transistor is gated by the voltage level of the first node to control an output of the first transistor with respect to the second node, the third transistor is gated by the clock signal to control a connection to ground, and the fourth transistor is gated by the voltage of the first node to control an output of the third transistor with respect to the second node.

According to another aspect of the inventive concept, there is provided a semiconductor circuit receiving an input data signal and a clock signal as inputs and providing an output data signal as an output. The semiconductor circuit includes; a first circuit determining a voltage of a first node in response to the clock signal and the input data signal, a first latch determining a voltage of a second node in response to the clock signal and the voltage of the first node, and a second circuit determining a voltage of a third node in response to the clock signal and the voltage of the second node. The output data signal is provided in response to the voltage of the third node, the clock signal controls a flip-flop operation with respect to the input data signal and the output data signal, and respective voltages are maintained constant at the first node, second node and third node regardless of level transitions in the clock signal so long as a level of the input data signal is maintained constant.

BRIEF DESCRIPTION OF THE DRAWINGS

The above and other aspects and features of the inventive concept will become more apparent by describing in detail example embodiments thereof with reference to the attached drawings, in which.

DETAILED DESCRIPTION

Figure 1:
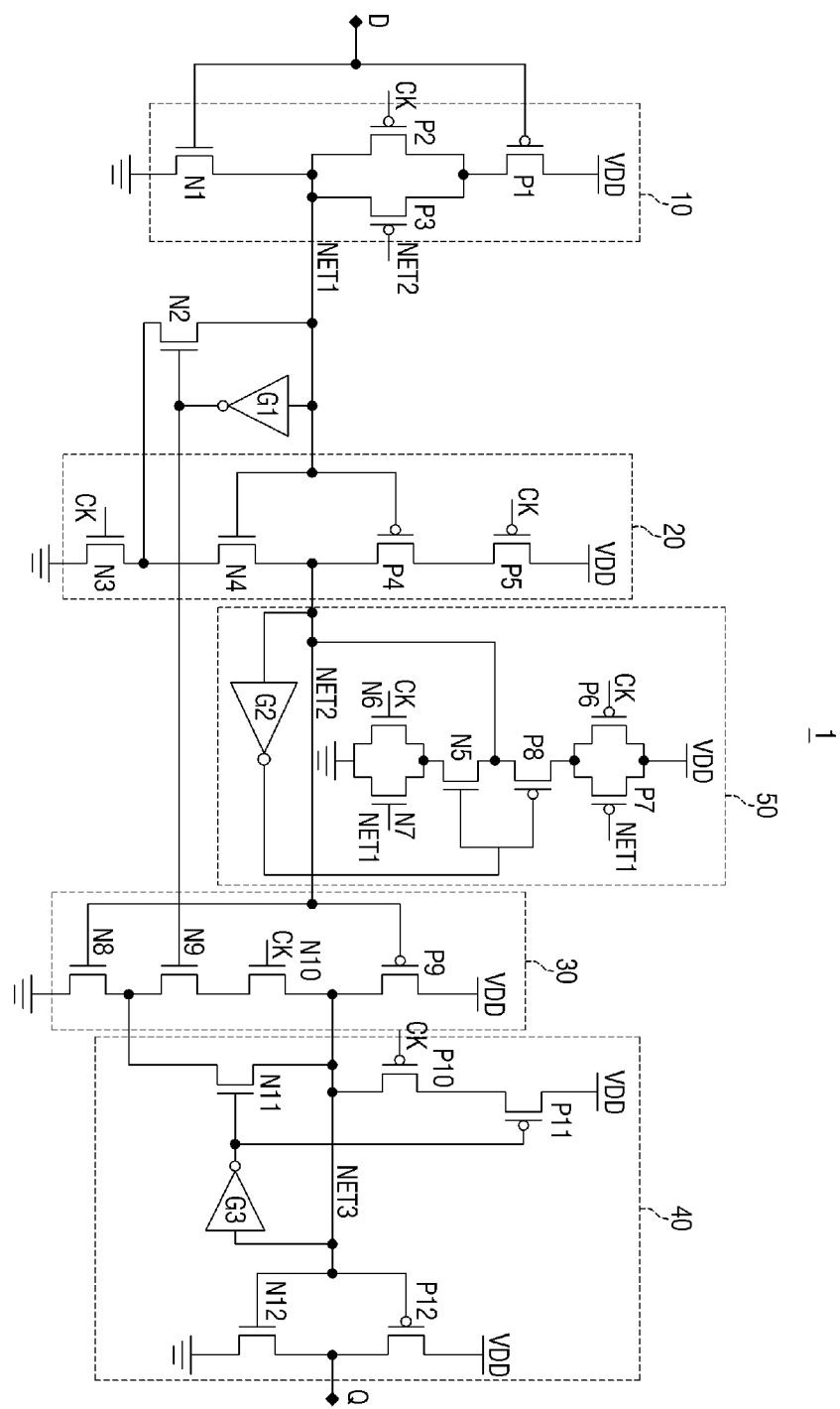
FIGS. 1, 4, 5, 6, 7 and 8 are respective diagrams illustrating various semiconductor circuits according to embodiments of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description that follows, P-type and N-type transistors are used as specific teaching examples. Those skilled in the art will understand that such specification denotes in the context of the illustrated embodiments the provision and/or use of a semiconductor transistor operating in relation to a first conductivity type" or a second conductivity type, generally. Hereafter, the terms "first type" and "second type" are used respectively for the sake of brevity. Further, the use of designators such as "first", "second", "P" and "N" with respect to transistor conductivity types are merely labels of convenience facilitating the description of the inventive concept. Such designations do not limit the nature or type of transistors that may be used in various embodiments of the inventive concept, and in practical application first type and second type transistors may be interchangeably used in various designs.

In the written description that follows, the term "node" is used to denote a point, section, or location within a semiconductor circuit that is characterized by a voltage. A node may be associated with an input or output of a circuit, a circuit portion, or one or more circuit elements.

FIG. 1 is a diagram of a semiconductor circuit 1 according to an embodiment of the inventive concept, including; a first circuit 10, a first latch 20, a second latch 30, a second circuit 40, and a feedback loop circuit 50.

The first circuit 10 may be used to determine (i.e., define the level of) a voltage of a first node NET1 in response to an input data signal D and an applied clock signal CK.

In the illustrated embodiment of FIG. 1, the first circuit 10 includes a first P-type transistor P1 gated by the input data signal D to control a connection within the first circuit 10 to a power supply voltage (e.g., VDD). First circuit 10 also includes a second P-type transistor P2 gated by the clock signal CK to control an output of the first P-type transistor P1 with respect to the first node NET1, a third P-type transistor P3 connected in parallel with the second P-type transistor P2 and gated by the voltage of a second node NET2, and a first N-type transistor N1 gated by the input data signal D to control a connection within the first circuit 10 to a ground voltage (hereafter, "ground").

Thus, in the illustrated embodiment of FIG. 1, the first and second P-type transistors P1 and P2, as well as the first N-type transistor N1 are connected in series between the power supply voltage VDD and ground. In the foregoing description the first, second and third P-type transistors P1, P2 and P3 may be respectively configured as P-channel metal oxide semiconductor (PMOS) transistors, while the first N-type transistor N1 may be configured as an N-channel metal oxide semiconductor (NMOS) transistor. However, those skilled in the art will recognize the particular use of transistor type(s) in the illustrated embodiments of the inventive concept are merely example, and P-type and N-type transistors, as well as related control signals, may vary according to design.

The first latch 20 may be used to determine a voltage of the second node NET2 in response to the voltage of the first node NET1 and the clock signal CK.

In the illustrated embodiment of FIG. 1, the first latch 20 includes; a fifth P-type transistor P5 gated by the clock signal CK to control a connection within the first latch 20 to the power supply voltage, a fourth P-type transistor P4 gated by the voltage of the first node NET1 to control the output of the fifth P-type transistor P5 with respect to the second node NET2, a third N-type transistor N3 gated by the clock signal CK to control a connection of the first latch 20 to ground, and a fourth N-type transistor N4 gated by the voltage of the first node NET1 to control the output of the third N-type transistor N3 with respect to the second node NET2.

Here again, the fourth and fifth P-type transistors P4 and P5 may be configured as PMOS transistors, and the third and fourth N-type transistors N3 and N4 may be configured as NMOS transistors.

The second latch 30 may be used to determine a voltage of a third node NET3 in response to the voltage of the second node NET2 and the clock signal CK.

In the illustrated embodiment of FIG. 1, the second latch 30 includes; a ninth P-type transistor P9 gated by the voltage of the second node NET2 to control a connection within the second latch 30 to the power supply voltage, an eighth N-type transistor N8 gated by the voltage of the second node NET2 to control a connection within the second latch 30 to ground, a ninth N-type transistor N9 controlling the output of the eighth N-type transistor N8 with respect to the third node NET3 and gated by an inverted version of the voltage of the first node NET1, and a tenth N-type transistor N10 gated by the clock signal CK.

The ninth P-type transistors P9 may be configured as a PMOS transistor, and the eighth, ninth and tenth N-type transistors N8, N9 and N10 may be configured as NMOS transistors.

The second circuit 40 may be used to control the providing (or output) of an output data signal Q in response to the voltage of the third node NET3 and the clock signal CK.

In the illustrated embodiment of FIG. 1, the second circuit 40 includes an eleventh P-type transistor P11 gated by an output of a third inverter G3 to control a connection within the second circuit 40 to the power supply voltage, a tenth P-type transistor P10 gated by the clock signal CK to control the output of the eleventh P-type transistor P11 with respect to the third node, and an eleventh N-type transistor N11 gated by the output of the third inverter G3 to control the output of an eighth N-type transistor N8.

In addition, the second circuit 40 may include a twelfth P-type transistor P12 gated by the voltage of the third node NET3 to control a connection of the power supply voltage VDD to an output data node at which the output data signal Q is provided and a twelfth N-type transistor N12 gated by the voltage of the third node NET3 to control connection of the output data node to ground.

The tenth, eleventh and twelfth P-type transistors P10, P11 and P12 included in the second circuit 40 may be configured as PMOS transistors, and the eleventh and twelfth N-type transistors N11 and N12 included in the second circuit 40 may be configured as NMOS transistors.

The feedback loop circuit 50 may be used to determine a "next voltage" of the second node NET2 in response to the clock signal CK, the voltage of the first node NET1, and a "previous voltage" of the second node NET2.

In the illustrated embodiment of FIG. 1, the feedback loop circuit 50 includes; a sixth P-type transistor P6 gated by the clock signal CK to control a connection of the feedback loop circuit 50 to the power supply voltage, a seventh P-type transistor P7 connected in parallel with the sixth P-type transistor P6 and gated by the voltage of the first node NET1 to further control the connection of the power supply voltage within the feedback loop circuit 50. In addition, the feedback loop circuit 50 of FIG. 1 includes; an eighth P-type transistor P8 gated by an inverted version of the voltage of the second node NET2 to control the output of the sixth and seventh P-type transistor P6 or P7 with respect to the second node NET2, a sixth N-type transistor N6 gated by the clock signal CK to control a connection within the feedback loop circuit 50 to ground, a seventh N-type transistor N7 connected in parallel with the sixth N-type transistor N6 and gated by the voltage of the first node NET1 to further control the connection of ground within the feedback loop circuit 50, and a fifth N-type transistor N5 gated by an output of a second inverter G2 receiving the voltage of the second node NET2 to control the output of the sixth and seventh N-type transistors N6 and N7 with respect to the second node NET2.

Within the foregoing configuration a first inverter G1 is connected to the first node NET1 to provide a second N-type transistor N2 and the ninth N-type transistor N9 with a common gating signal that is essentially the inverted voltage of the first node NET1. In the example illustrated in FIG. 1, the second N-type transistor N2 is connected between the first node NET1 and a node between the third and fourth N-type transistors N3 and N4.

Assuming that the input data signal D remains at a constant level (e.g., an input data signal level associated with a logical data value of '1' or '0'), the feedback loop circuit 50 may be used to control the level (e.g., a high level (H), or a low level (L)) of the previous voltage of the second node NET2 in response to the clock signal CK. Further, the feedback loop circuit 50 may be used to control the level of the next voltage of the second node NET2 in response to the clock signal CK. For example, in a case where the level of the input data signal D is L, while the level of the clock signal CK transitions from H to L, the level (e.g., L) of the voltage of the second node NET2 determined when the clock signal CK is H may be maintained when the clock signal CK is L. That is, the level of the voltage of the second node NET2 determined when the clock signal CK is L may also be L. Likewise, in a case where the level of the input data signal D remains H while the clock signal CK transitions from L to H, the level (e.g., H) of the voltage of the second node NET2 determined when the clock signal CK is L may be maintained when the clock signal CK is H.

In the illustrated embodiment of FIG. 1, the sixth, seventh and eighth P-type transistors P6, P7 and P8 included in the feedback loop circuit 50 may be configured as PMOS transistors, and the fifth, sixth and seventh N-type transistors N5, N6 and N7 included in the feedback loop circuit 50 may be configured as NMOS transistors. However, the scope of the inventive concept is not limited to only this particular configuration, but the feedback loop circuit 50 may be modified as desired such that a previous voltage level of the second node NET2 determined when the clock signal CK is at a first level and a next voltage level of the second node NET2 determined when the clock signal CK is at a second level, different from the first level, may be maintained, where the level of the input data signal D remains constant.

In the foregoing description, it may be understood that the clock signal CK operates to provide a flip-flop type operation. However, the semiconductor circuit 1 of FIG. 1 is able to maintain the voltage levels respectively apparent of the first, second and third nodes NET1, NET2 and NET3 constant regardless of changes in the voltage level of the clock signal CK, so long as the voltage level of the input data signal D is maintained constant. In this manner, certain embodiments of the inventive concept are able to prevent repeated pre-charging/discharging in response to continuous transitions of the clock signal CK, where the level of the input data signal D remains constant. As a result, the flip-flop operation performance may be appropriately maintained, and with relatively lower power consumption.

Figure 2A:
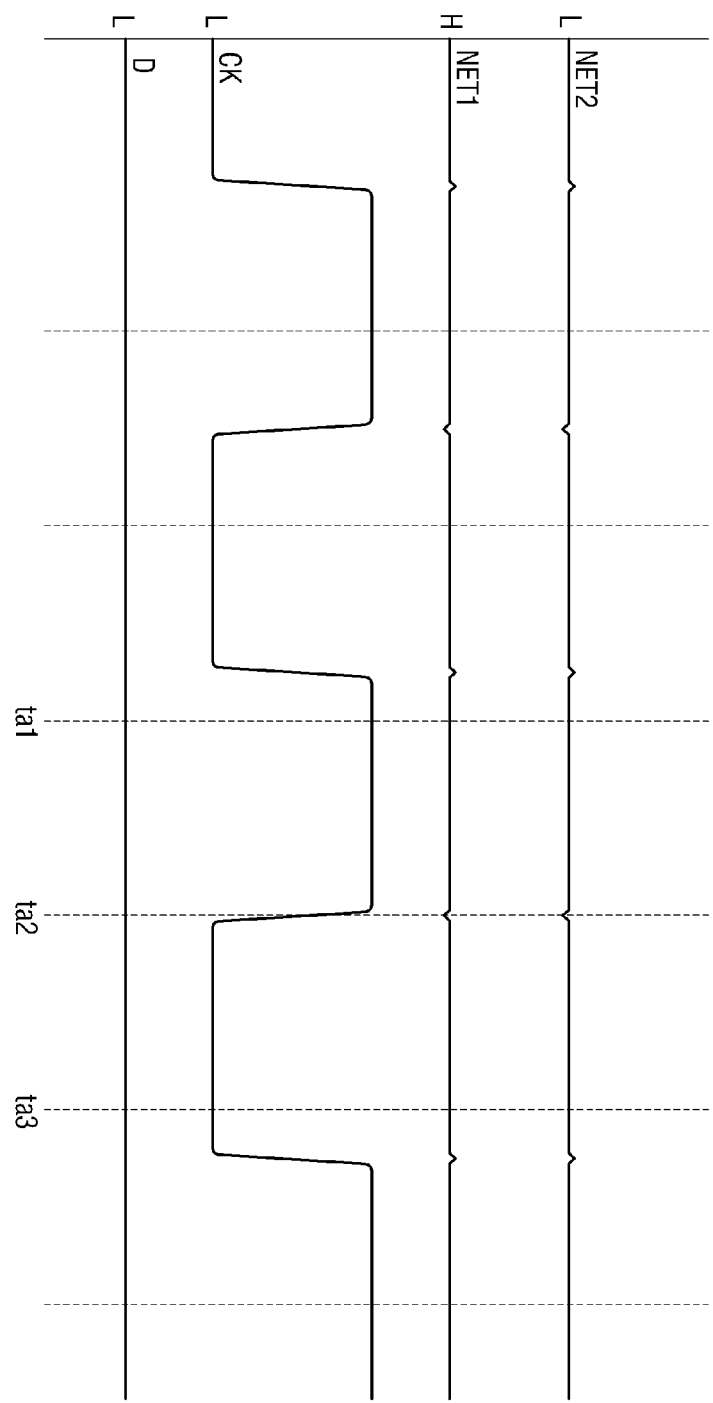
FIGS. 2A, 2B, 3A and 3B are respective timing diagrams further illustrating the operation of the semiconductor circuits according to embodiments of the inventive concept.
Figure 2B:
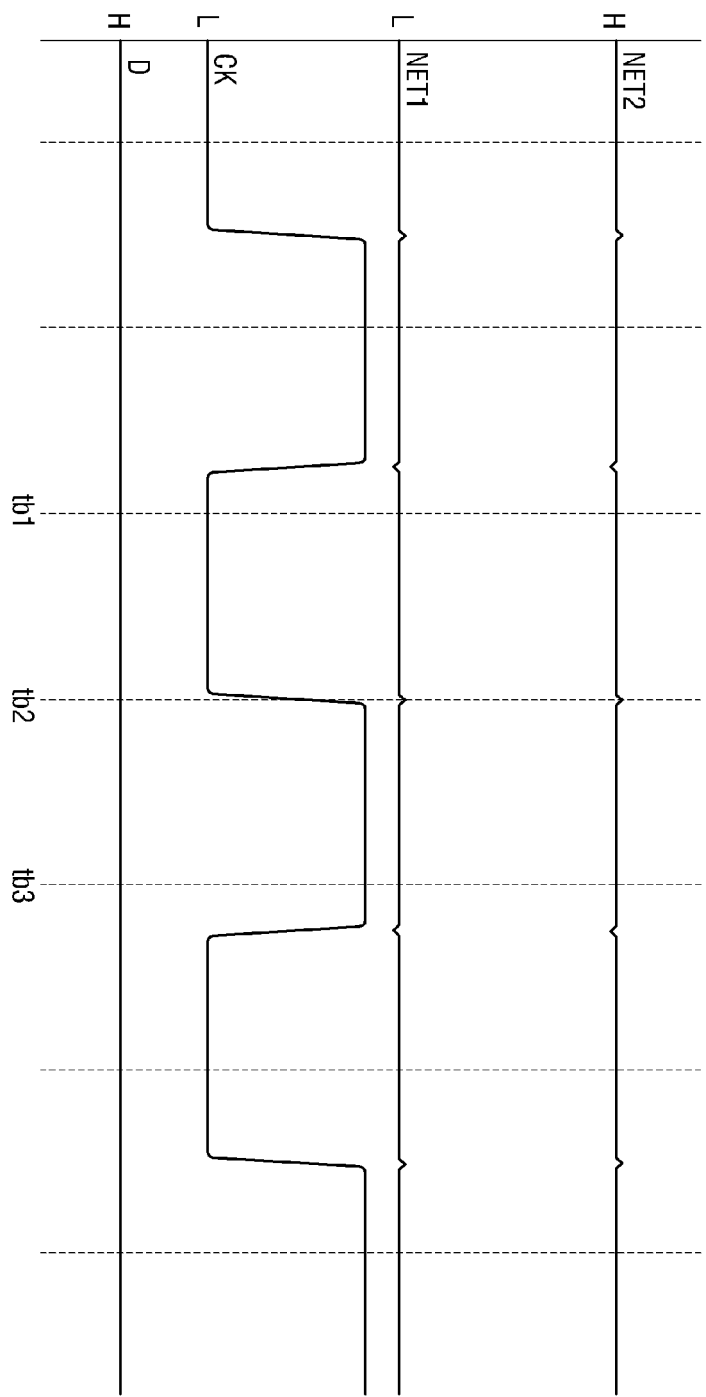

FIGS. 2A and 2B are timing diagrams further illustrating operation of the semiconductor circuit 1 of FIG. 1 according to certain embodiments of the inventive concept.

Referring collectively to FIGS. 1 and 2A, in a case where the input data signal D is maintained at L and the clock signal CK repeatedly transitions between L and H, the voltages of the first, second and third nodes NET1, NET2 and NET3 are maintained respectively at H, L, and H.

Specifically, at a first time ta1, the level of the input data signal D is assumed to be L, and the level of the clock signal CK is assumed to be H. Thus, at the first time ta1, since the input data signal D is L, the first P-type transistor P1 gated by the input data signal D is turned ON. On the other hand, the second P-type transistor P2 connected in series with the first P-type transistor P1 and gated by the clock signal CK and the first N-type transistor N1 gated by the input data signal D are turned OFF. Here, the third P-type transistor P3 connected in parallel with the second P-type transistor P2 and gated by the voltage of the second node NET2 to control the output of the first P-type transistor P1 with respect to the first node NET1 is turned ON. Accordingly, the first and third P-type transistors P1 and P3 pull up the first node NET1, thereby determining the level of the voltage of the first node NET1—in the working example of FIG. 2A at time ta1—at H. Here, the third P-type transistor P3 is turned ON because the voltage of the second node NET2 is L, while the level of the input data signal D remains L.

With respect to the first latch 20 at the first time ta1, the fifth P-type transistor P5 gated by the clock signal CK and the fourth P-type transistor P4 gated by the voltage of the first node NET1 are both turned OFF. In addition, the third N-type transistor N3 gated by the clock signal CK and the fourth N-type transistor N4 connected in series with the third N-type transistor N3 and gated by the voltage of the first node NET1 are turned ON. Accordingly, the third and fourth N-type transistors N3 and N4 pull down the second node NET2, thereby determining the voltage of the second node NET2—in the working example of FIG. 2A—at L.

With respect to the second latch 30 at the first time ta1, the ninth P-type transistor P9 gated by the voltage of the second node NET2 and the tenth N-type transistor N10 gated by the clock signal CK are turned ON. In addition, the ninth N-type transistor N9 connected in series with the tenth N-type transistor N10 and gated by the inverted voltage of the first node NET1 and the eighth N-type transistor N8 connected in series with the ninth N-type transistor N9 and gated by the voltage of the second node NET2 are turned OFF. Accordingly, the ninth P-type transistor P9 pulls up the third node NET3, thereby determining the voltage of the third node NET3—in the working example of FIG. 2A—at H.

With further reference to FIGS. 1 and 2A, at a second time ta2 following the first time ta1, the input data signal D is assumed to remains at L, and the clock signal CK is assumed to transition from H to L. Then, at a third time ta3 following the second time ta2, the input data signal D is till assumed to remains L, and the clock signal CK is assumed to remain L.

Referring to the first circuit 10 at the third time ta3, the first P-type transistor P1 gated by the input data signal D and the second P-type transistor P2 connected in series with the first P-type transistor P1 and gated by the clock signal CK are turned ON. In addition, the first N-type transistor N1 gated by the input data signal D is turned OFF. Accordingly, the first and second P-type transistors P1 and P2 pull up the first node NET1, thereby determining the voltage of the first node NET1—in the working example of FIG. 2A—at H.

With respect to the first latch 20 at the third time ta3, the fifth P-type transistor P5 gated by the clock signal CK and the fourth N-type transistor N4 gated by the voltage of the first node NET1 are turned ON. In addition, the fourth P-type transistor P4 gated by the voltage of the first node NET1 and the third N-type transistor N3 gated by the clock signal CK are turned OFF. Accordingly, the first latch 20 prevents the second node NET2 from being pre-charged under the foregoing conditions.

Instead, the feedback loop circuit 50 disposed between an output of the first latch 20 and an input of the second latch 30 maintains the level of the voltage of the second node NET2 at the first time ta1 when the clock signal CK is H, and also at the second time ta2 when the clock signal CK is L.

Specifically, in the feedback loop circuit 50, the sixth P-type transistor P6 gated by the clock signal CK, the fifth N-type transistor N5 gated by the inverted voltage of the second node NET2, and the seventh N-type transistor N7 gated by the voltage of the first node NET1 are turned ON. In addition, the seventh P-type transistor P7 gated by the voltage apparent of the first node NET1, the eighth P-type transistor P8 gated by the inverted voltage of the second node NET2, and the sixth N-type transistor N6 gated by the clock signal CK are turned OFF. Accordingly, the fifth and seventh N-type transistors N5 and N7 pull down the second node NET2, thereby maintaining the level of the voltage at the second node NET2 at L.

With respect to the second latch 30, the ninth P-type transistor P9 gated by the voltage of the second node NET2 is turned ON. In addition, the tenth N-type transistor N10 gated by the clock signal CK, the ninth N-type transistor N9 connected in series with to the tenth N-type transistor N10 and gated by the inverted voltage of the first node NET1, and the eighth N-type transistor N8 connected in series with the ninth N-type transistor N9 and gated by the voltage of the second node NET2 are turned OFF. Accordingly, the ninth P-type transistor P9 pulls up the third node NET3, thereby maintaining the voltage level of the third node NET3 at H.

As described above, in a case where the input data signal D remains at a constantly L level, the voltages of the first, second and third nodes NET1, NET2 and NET3 are respectively maintained at H, L, and H regardless of changes in the level of the clock signal CK. Accordingly, it is possible to prevent repeated pre-charging/discharging in response to continuous transitions in the level of the clock signal CK in the case where the level of the input data signal D is maintained constant. As a result, the flip-flop operation performance may be appropriately maintained, but with a relatively lower power consumption.

Referring now to FIGS. 1 and 2B, in a case where the level of the input data signal D is maintained at H and where the level of the clock signal CK repeatedly transitions between L and H, the voltages of the first, second and third nodes NET1, NET2 and NETS are maintained at L, H, and L, respectively.

Specifically, at a first time tb1, the level of the input data signal D is assumed to be H, and the level of the clock signal CK is assumed to be L.

With respect to the first circuit 10 at the first time tb1, since the level of the input data signal D is H, the first N-type transistor N1 gated by the input data signal D and the second P-type transistor P2 gated by the voltage of the clock signal CK are turned ON. In addition, the first P-type transistor P1 gated by the input data signal D is turned OFF. Accordingly, the first N-type transistor N1 pulls down the first node NET1, thereby determining the voltage of the first node NET1—in the working example of FIG. 2B—a L.

With respect to the first latch 20, the fifth P-type transistor P5 gated by the clock signal CK and the fourth P-type transistor P4 connected in series with the fifth P-type transistor P5 and gated by the voltage of the first node NET1 are turned ON. In addition, the third N-type transistor N3 gated by the clock signal CK and the fourth N-type transistor N4 connected in series with the third N-type transistor N3 and gated by the voltage of the first node NET1 are turned OFF. Accordingly, the fourth ad fifth P-type transistors P4 and P5 pull up the second node NET2, thereby determining the voltage of the second node NET2—in the working example of FIG. 2B—a H.

With respect to the second latch 30, the ninth P-type transistor P9 gated by the voltage of the second node NET2 and the tenth N-type transistor N10 gated by the clock signal CK are turned OFF. In addition, the ninth N-type transistor N9 connected in series with the tenth N-type transistor N10 and gated by the inverted voltage of the first node NET1 and the eighth N-type transistor N8 connected in series with the ninth N-type transistor N9 and gated by the voltage of the second node NET2 are turned ON. Accordingly, the eighth N-type transistor N8 pulls down the third node NET3, thereby determining the voltage of the third node NET3—in the working example of FIG. 2B—a L.

At a second time tb2 following the first time tb1, the input data signal D is assumed to remain at H, and the clock signal CK is assumed to transition from L to H. Then, at a third time tb3 following the second time tb2, the input data signal D is assumed to remain at H, and the clock signal CK is assumed to also remain at H.

With respect to the first circuit 10 at the third time tb3, since the input data signal D is H, the first N-type transistor N1 gated by the input data signal D is turned ON. In addition, the first P-type transistor P1 gated by the input data signal D and the second P-type transistor P2 connected in series with the first P-type transistor P1 and gated by the clock signal CK are turned OFF. Accordingly, the first N-type transistor N1 pulls down the node NET1, thereby maintaining the voltage of the first node NET1 at L.

With respect to the first latch 20, the fifth P-type transistor P5 gated by the clock signal CK and the fourth N-type transistor N4 gated by the voltage of the first node NET1 are turned OFF. In addition, the fourth P-type transistor P4 gated by the voltage of the first node NET1 and the third N-type transistor N3 gated by the clock signal CK are turned ON. Accordingly, the first latch 20 prevents the second node NET2 from being discharged under the foregoing conditions.

Instead, the feedback loop circuit 50 disposed between the output of the first latch 20 and the input of the second latch 30 maintains the voltage level of the second node NET2 at the first time tb1 when the clock signal CK was L, and also at the second time tb2 when the clock signal CK is H.

Specifically, with respect to the feedback loop circuit 50, the sixth P-type transistor P6 gated by the clock signal CK, the fifth N-type transistor N5 gated by the inverted voltage of the second node NET2, and the seventh N-type transistor N7 gated by the voltage of the first node NET1 are turned OFF. In addition, the seventh P-type transistor P7 gated by the voltage of the first node NET1, the eighth P-type transistor P8 gated by the inverted voltage of the second node NET2, and the sixth N-type transistor N6 gated by the clock signal CK are turned ON. Accordingly, the seventh and eighth P-type transistors P7 and P8 pull up the second node NET2, thereby maintaining the voltage level of the second node NET2 at H.

With respect to the second latch 30, the ninth P-type transistor P9 gated by the voltage of the second node NET2 is turned OFF. In addition, the tenth N-type transistor N10 gated by the clock signal CK, the ninth N-type transistor N9 connected in series with the tenth N-type transistor N10 and gated by the inverted voltage of the first node NET1, and the eighth N-type transistor N8 connected in series with the ninth N-type transistor N9 and gated by the voltage of the second node NET2 are turned ON. Accordingly, the tenth N-type transistor N10, the ninth P-type transistor P9 and the eighth N-type transistor N8 pull down the third node NET3, thereby maintaining the voltage level of the third node NET3 at L.

As described above, in a case where the input data signal D is maintained at a constant H, the voltage of the first, second and third nodes NET1, NET2 and NET3 are respectively maintained at L, H, and L regardless of changes in the level of the clock signal CK. Accordingly, it is possible to prevent repeated pre-charging/discharging in response to continuous transitions in the clock signal CK in the case where the level of the input data signal D is maintained constant. As a result, the flip-flop operation performance may be appropriately maintained, but at a relatively lower power consumption.

Figure 3A:
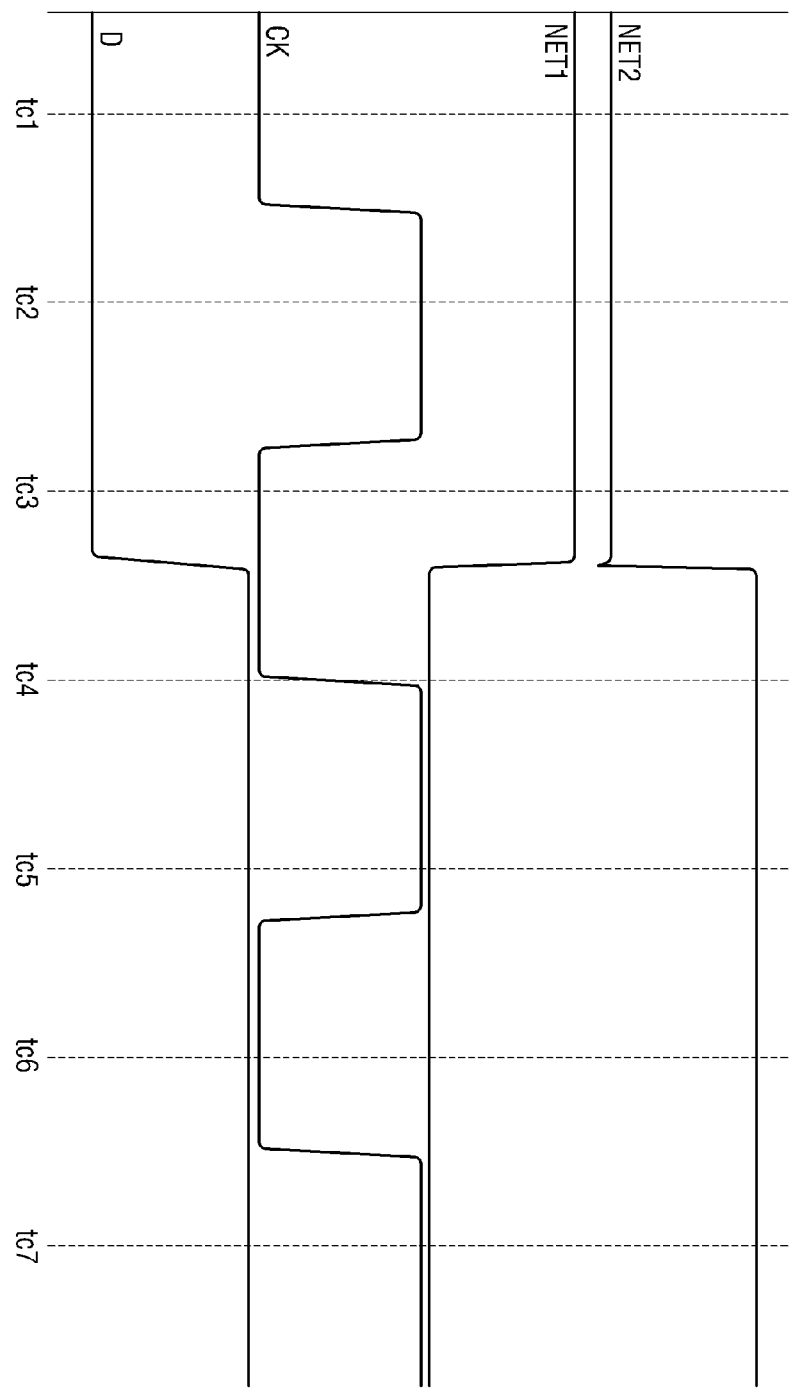
Figure 3B:
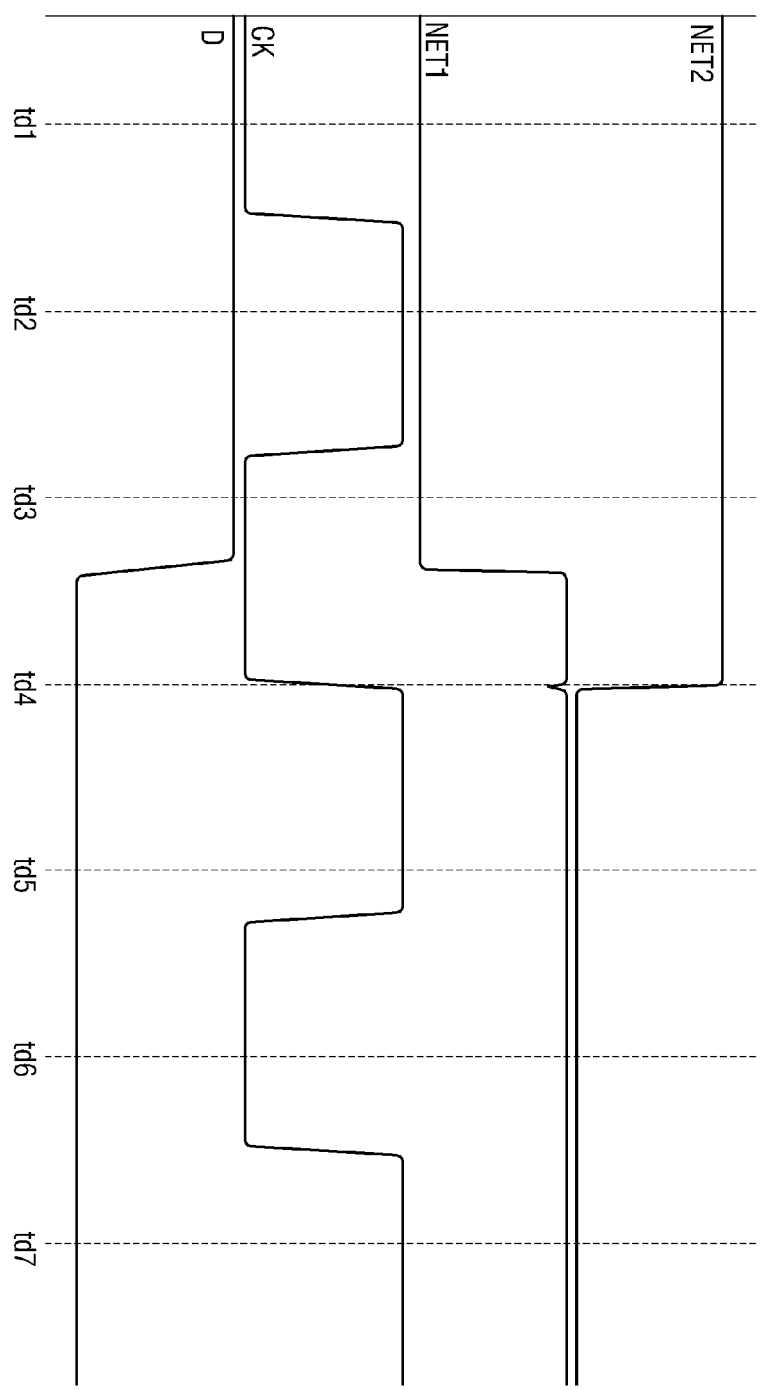

FIGS. 3A and 3B are additional timing diagrams further illustrating the operation of the semiconductor circuit 1 illustrated in FIG. 1.

Referring to FIGS. 1 and 3A, times tc2 and tc3 are assumed to respectively correspond to the times ta1 and ta2 of FIG. 2A, and times tc5 and tc6 are assumed to respectively correspond to the times tb1 and tb2 of FIG. 2B.

The level of the input data signal D is assumed to be L between times tc1 and tc3, and is further assumed to be H between times tc4 and tc7. Accordingly, even when the clock signal CK repeatedly transitions between L and H during times tc1 through tc3 according to the operation of the semiconductor circuit 1, the voltage of the first and second nodes NET1 and NET2 are maintained at H and L, respectively. In addition, even if the clock signal CK repeatedly transitions between L and H during times tc4 through tc7, the voltages of the first and second nodes NET1 and NET2 are maintained at L and H, respectively.

Referring to FIG. 3B, times td1 and td2 are assumed to respectively correspond to the times tb1 and tb2 of FIG. 2B, and times td5 and td6 are assumed to respectively correspond to the times ta1 and ta2 of FIG. 2A.

The input data signal D is maintained at H during times td1 through td3 and maintained at L during times td4 through td7. Even if the clock signal CK repeatedly transitions between L and H during the times td1 through td3 according to the operation of the semiconductor circuit 1, the voltages of the first and second nodes NET1 and NET2 are maintained at L and H, respectively. In addition, even if the clock signal CK repeatedly transitions between L and H during the times td4 through td7, the voltages of the first and second nodes NET1 and NET2 are maintained at H and L, respectively.

Figure 4:
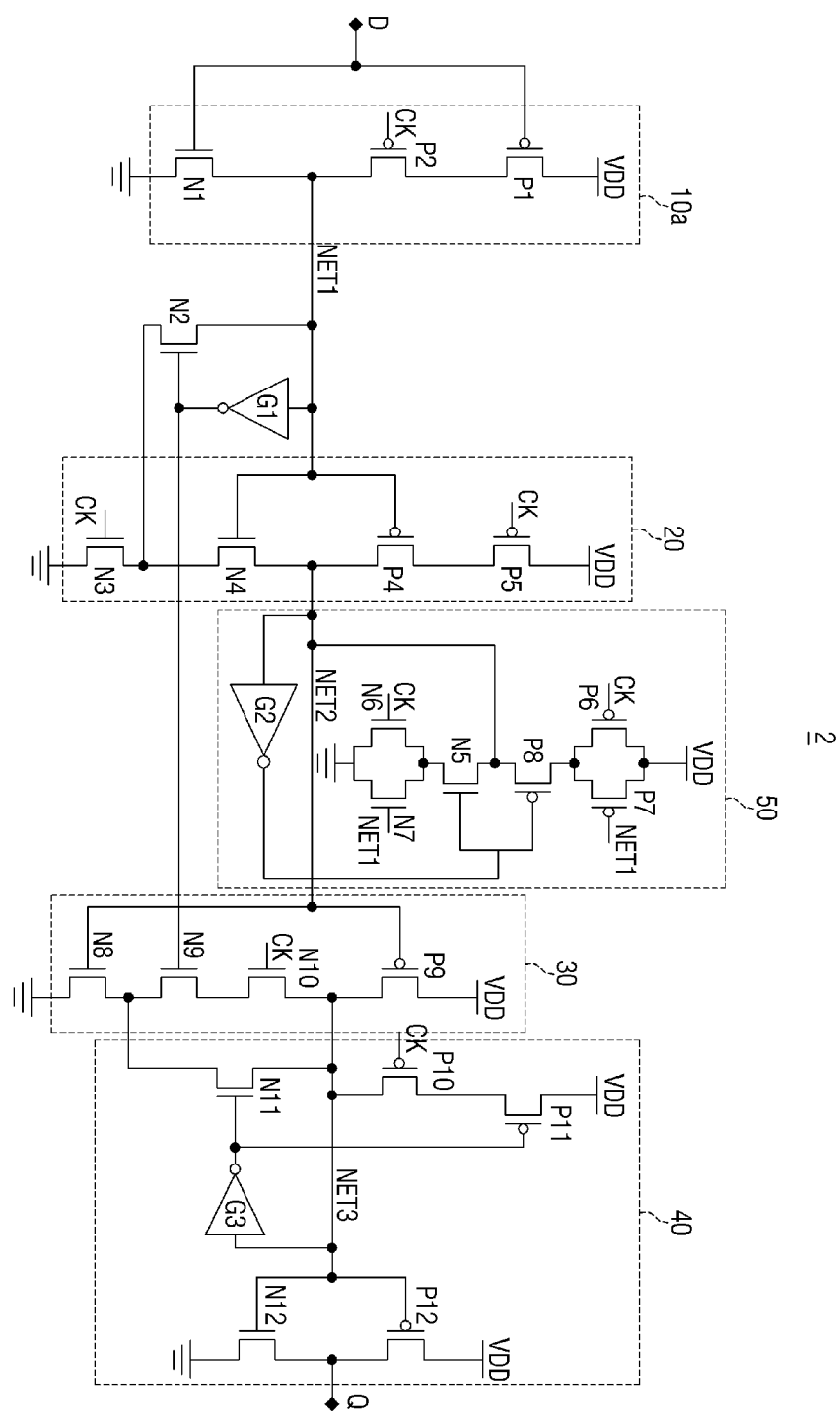

FIG. 4 is a diagram of a semiconductor circuit 2 according to another embodiment of the inventive concept.

The semiconductor circuit 2 of FIG. 4 differs from the semiconductor circuit 1 of FIG. 1 in that the first circuit 10 of semiconductor circuit 1 includes the third P-type transistor P3 connected in parallel with the second P-type transistor P2. and gated by the voltage of the second node NET2, whereas the semiconductor circuit 2 of FIG. 4 includes a first circuit 10a including a first P-type transistor P1 gated by the input data signal D to control a connection with the power supply voltage VDD, a second P-type transistor P2 gated by the clock signal CK to deliver an output of the first P-type transistor P1 with respect to the first node NET1. The first N-type transistor N1 is again provided in series connection with the first and second P-type transistors P1 and P2 and gated by the input data signal D to control a connection with ground.

That is, the first circuit 10a of the semiconductor circuit 2 need not contain the third P-type transistor P3 connected in parallel to the second P-type transistor P2, as was suggested by the embodiment shown in FIG. 1.

In the previous embodiment of FIG. 1, the third P-type transistor P3 is configured to be gated by the voltage of the second node NET2 in order to maintain the first node NET1 at H in a case where the input data signal D is L and where the clock signal CK is H. However, even when the first node NET1 is floating, if the second node NET2 is discharged while the first node NET1 is maintained at H, the semiconductor circuit 2 of FIG. 4, like the semiconductor circuit 1 according to the embodiment of FIG. 1, may be operated while preventing repeated pre-charging/discharging in response to continuous transitions in the clock signal CK in a case where the level of the input data signal D is maintained constant.

Figure 5:
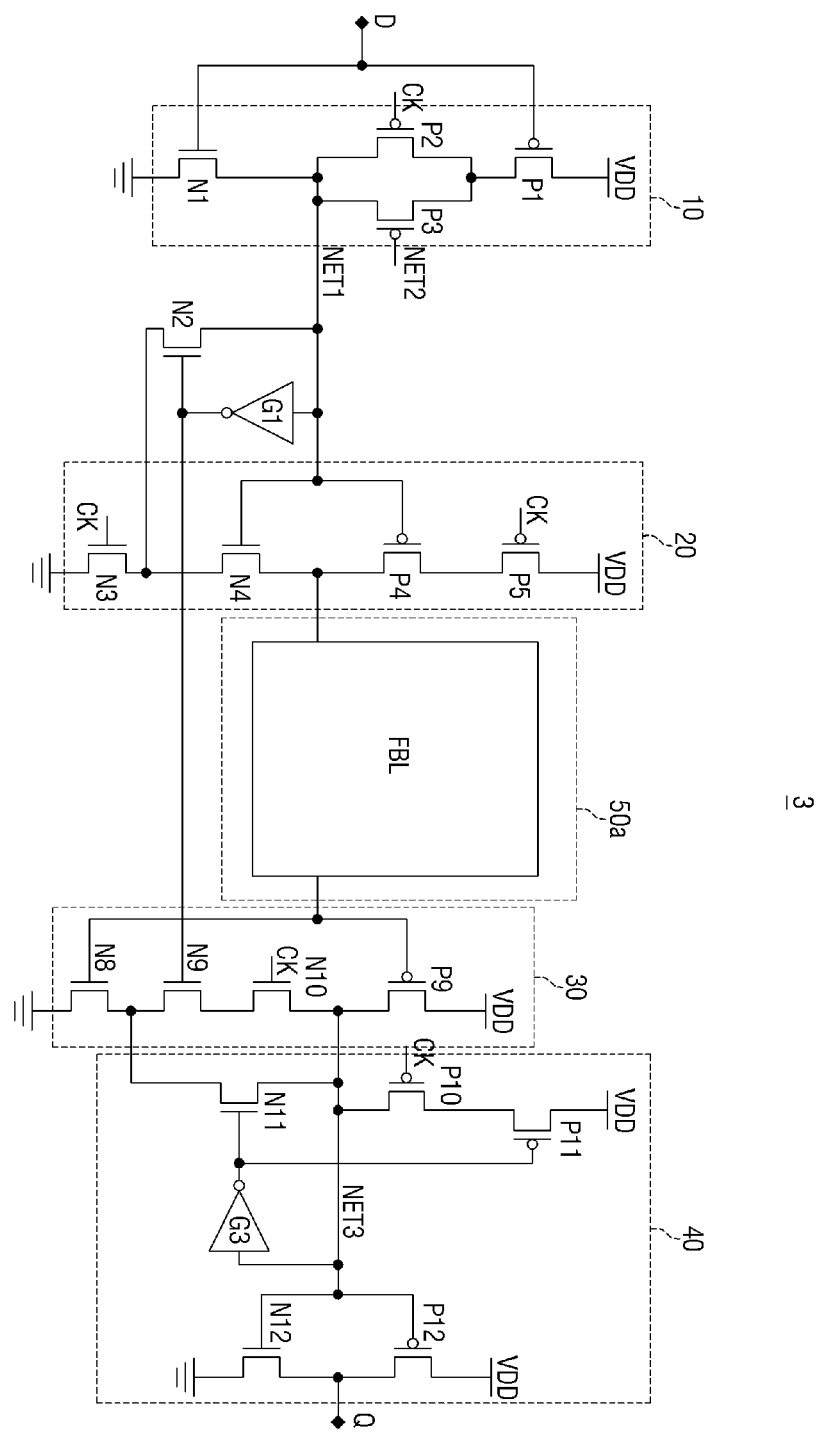

FIG. 5 is a diagram of a semiconductor circuit 3 according to another embodiment of the inventive concept.

The semiconductor circuit 3 according to the embodiment of FIG. 5 is different from the semiconductor circuit 1 according to the embodiment of FIG. 1 in that a feedback loop circuit 50a disposed between an output of the first latch 20 and an input of the second latch 30 is configured differently from the feedback loop circuit 50 of FIG. 1. That is, an arbitrary circuit capable of maintaining a voltage level of the second node NET2 at a time when the clock signal CK is at a first level, and also at a time when the clock signal CK is at a second level may be disposed between the output of the first latch 20 and the input of the second latch 30.

Figure 6:
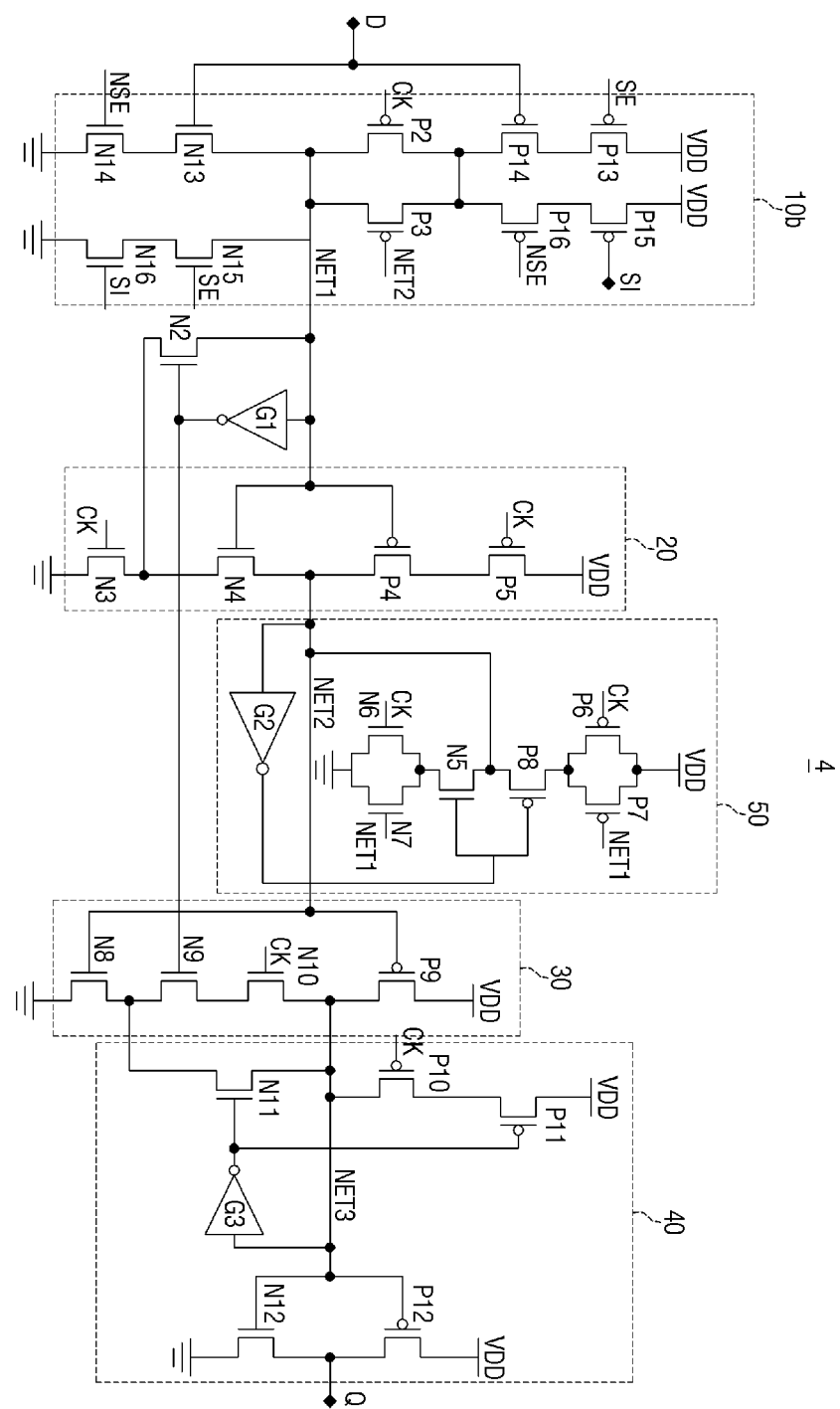

FIG. 6 is a diagram of a semiconductor circuit 4 according to another embodiment of the inventive concept.

Referring to FIG. 6, the semiconductor circuit 4 according to the embodiment of FIG. 6 includes a control circuit 10b including P-type transistors P13, P14, P15, P16, as well as N-type transistors N13, N14, N15 and N16, in addition to second and third P-type transistors P2 and P3 of semiconductor circuit 1 of FIG. 1. The control circuit 10b receives a scan enable signal SE as a control signal capable of controlling the operation (i.e., the provision of the output data signal Q) of the semiconductor circuit 4. When the scan enable signal SE is activated, a level of output data signal Q will be determined according to the level of a scan input signal SI. When the scan signal SE is inactivated, the level of the output data signal Q will be determined according to the level of input data signal D.

Specifically, a control circuit 10b includes the thirteenth and fourteenth P-type transistors P13 and P14 arranged in series between the power supply voltage VDD and a node connecting the inputs of the second and third P-type transistors P2 and P3. The thirteenth P-type transistor P13 is gated by the scan enable signal SE and the fourteenth P-type transistor P14 is gated by the input data signal D. The control circuit 10b also includes the fifteenth and sixteenth P-type transistors P15 and P16 arranged in series between the power supply voltage VDD and the node connecting the inputs of the second and third P-type transistors P2 and P3.

The fifteenth P-type transistor P15 is gated by a scan input signal SI and the sixteenth P-type transistor is gated by an inverted version of the scan enable signal SE (hereafter, the "inverted scan enable signal" or "NSE").

In similar arrangement, the control circuit 10b includes the thirteenth and fourteenth N-type transistors N13 and N14 arranged in series between ground and the first node NET1 (also a node connecting the outputs of the second and third P-type transistors P2 and P3). The thirteenth N-type transistor N13 is gated by the input data signal D and the fourteenth N-type transistor N14 is gated by the inverted scan enable signal NSE. The control circuit 10b also includes the fifteenth and sixteenth N-type transistors N15 and N16 arranged in series between ground and the first node NET1. The fifteenth N-type transistor N15 is gated by a scan enable signal SE and the sixteenth N-type transistor N16 is gated by the scan input signal SI.

Figure 7:
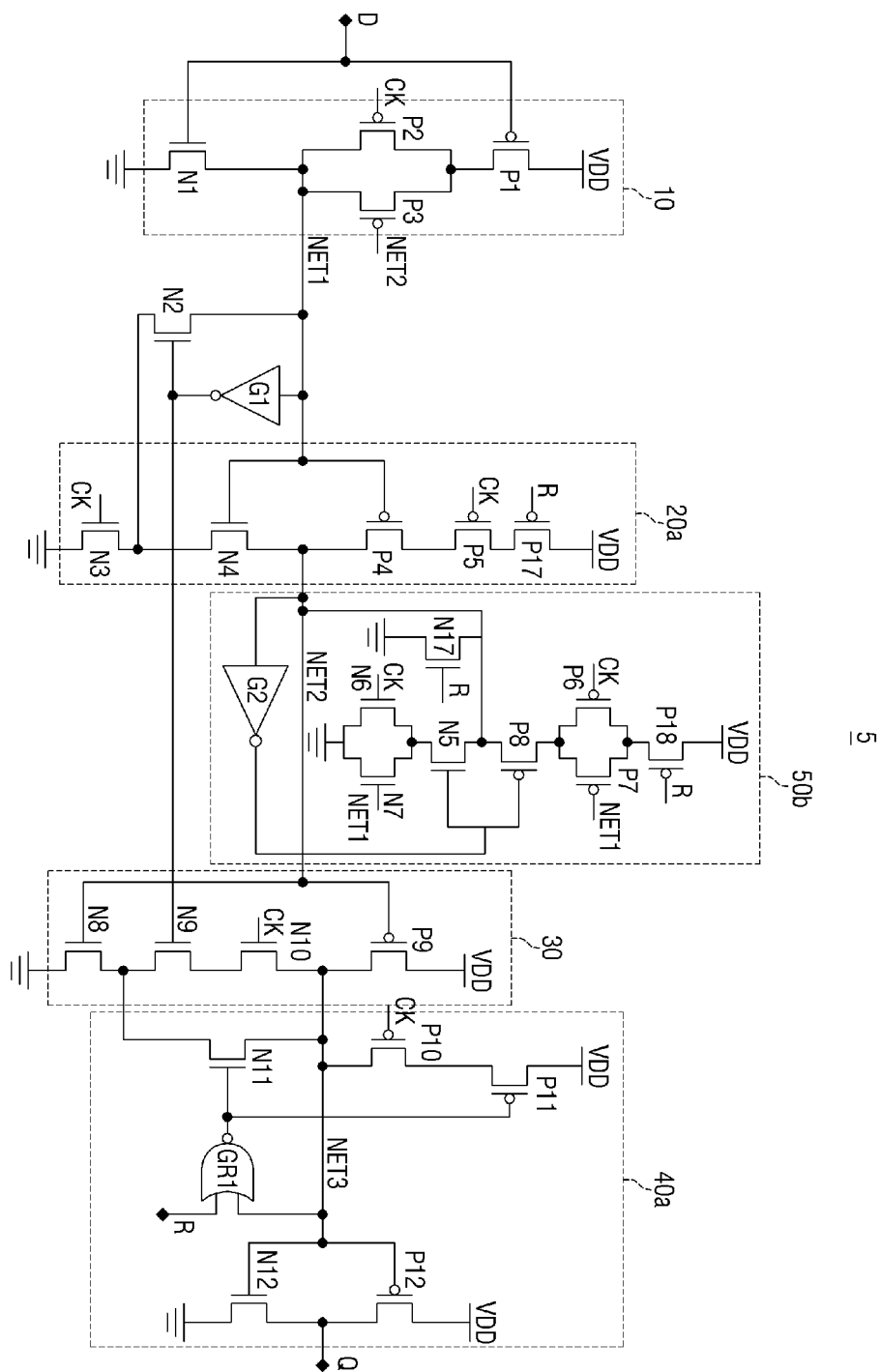

FIG. 7 is a diagram of a semiconductor circuit 5 according to another embodiment of the inventive concept.

Referring to FIGS. 1 and 7, the semiconductor circuit 5 includes—relative to the semiconductor circuit 1 of FIG. 1—a first latch circuit 20a further including a seventeenth P-type transistor P17 connected between the power supply voltage VDD and the fifth P-type transistor P5 gated by the clock signal. Here, the seventeenth P-type transistor P17 is gated by a reset signal R used as an additional control signal with respect to the semiconductor circuit 5. When the reset signal R is activated, the level of output data signal Q is maintained at a second level (e.g., L), and when the reset signal R is inactivated, the level of the output data signal Q will be determined according to the level of input data signal D.

Referring still to FIGS. 1 and 7, the semiconductor circuit 5 includes—relative to the semiconductor circuit 1 of FIG. 1—a feedback loop circuit 50b further including a seventeenth N-type transistor N17 connected between second node NET2 and ground, as well as a eighteenth P-type transistor P18 connected between the power supply voltage VDD and a node connecting the sixth and seventh P-type transistors. Both of the seventeenth N-type transistor N17 and eighteenth P-type transistor P18 are gated by the reset signal R.

Referring still to FIGS. 1 and 7, the semiconductor circuit 5 includes—relative to the semiconductor circuit 1 of FIG. 1—a second circuit 40a including a NOR logic gate GR1 in place of the third inverter G3. The NOR logic gate GR1 receives the voltage of the third node NET5 and the reset signal R as inputs to selectively provide an output signal commonly applied to the gates the eleventh N-type transistor N11 and the eleventh P-type transistor P11.

Figure 8:
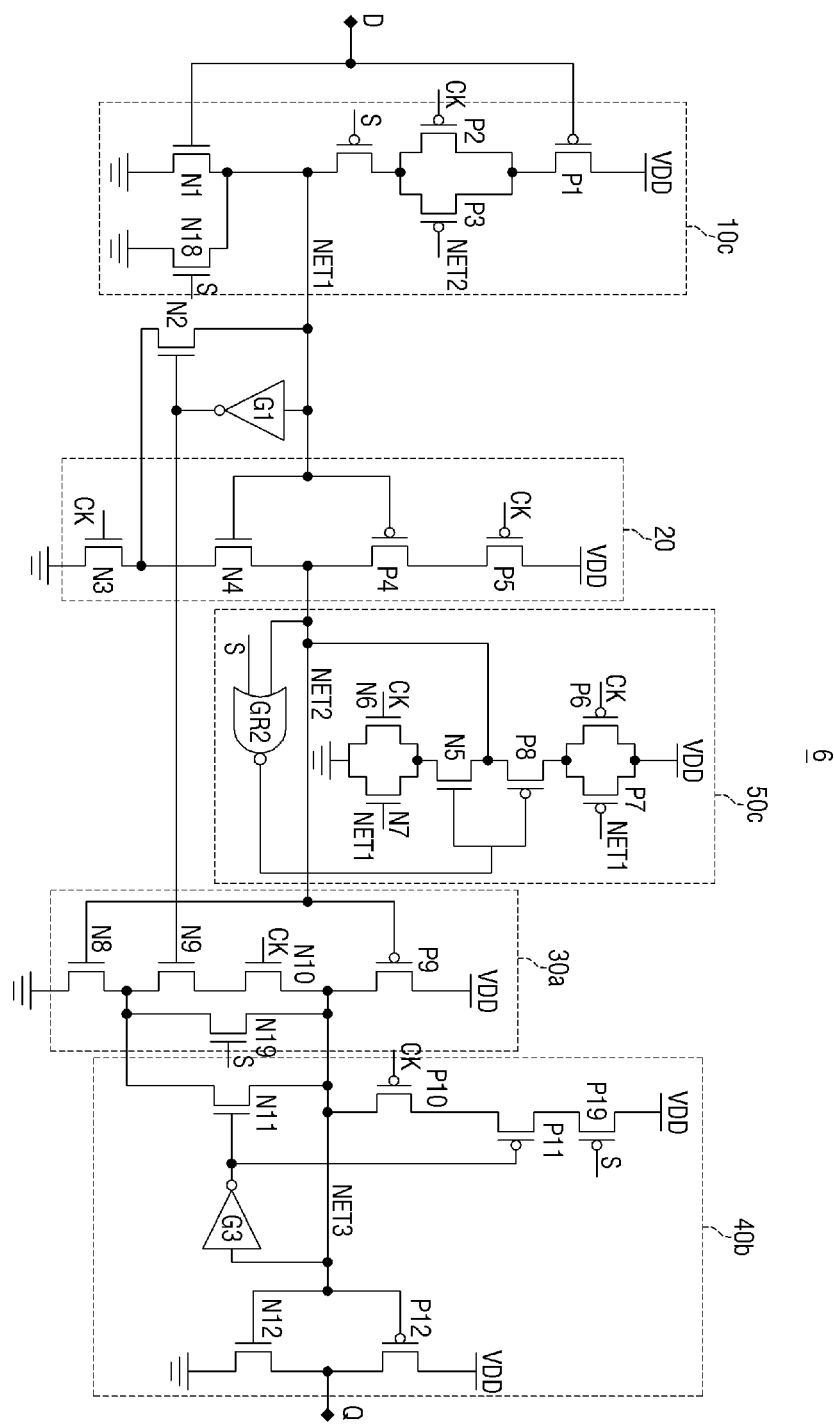

FIG. 8 is a diagram of a semiconductor circuit 6 according to another embodiment of the inventive concept.

Referring to FIGS. 1 and 8, the semiconductor circuit 6 includes—relative to the semiconductor circuit 1 of FIG. 1—a first circuit 10c further including a eighteenth N-type transistor N18 connected in parallel with the first N-type transistor N1 and gated by a set signal S, provide das a further control signal for controlling the semiconductor circuit 6. When the set signal S is activated, the level of output data signal Q is maintained at a first level (e.g., H), and when the set signal S is inactivated, the level of the output data signal Q will be determined according to the level of input data signal D.

Referring still to FIGS. 1 and 8, the semiconductor circuit 6 includes—relative to the semiconductor circuit 1 of FIG. 1—a feedback loop circuit 50c further including a NOR logic gate GR2 in place of the second inverter G2. The NOR logic gate GR2 receives the voltage of the second node NET2 and the set signal S as inputs to selectively provides an output signal commonly applied to the gates the fifth N-type transistor N5 and the eighth P-type transistor P8.

Referring still to FIGS. 1 and 8, the semiconductor circuit 6 includes—relative to the semiconductor circuit 1 of FIG. 1—a second latch 30a further including a nineteenth N-type transistor N19 connected in parallel with the eleventh N-type transistor of the second circuit 40b. Here, the nineteenth N-type transistor N19 is also gated by the set signal S to control the output of the eighth N-type transistor N8 with respect to the third node NET3.

Referring still to FIGS. 1 and 8, the semiconductor circuit 6 includes—relative to the semiconductor circuit 1 of FIG. 1—a second circuit 40b further including a nineteenth P-type transistor P19 connected between the eleventh P-type transistor P11 and the power supply voltage VDD. The nineteenth P-type transistor P19 is gated by an inverted version of the set signal S to further control the connection of the power supply voltage VDD in the second circuit 40b.

Figure 9:
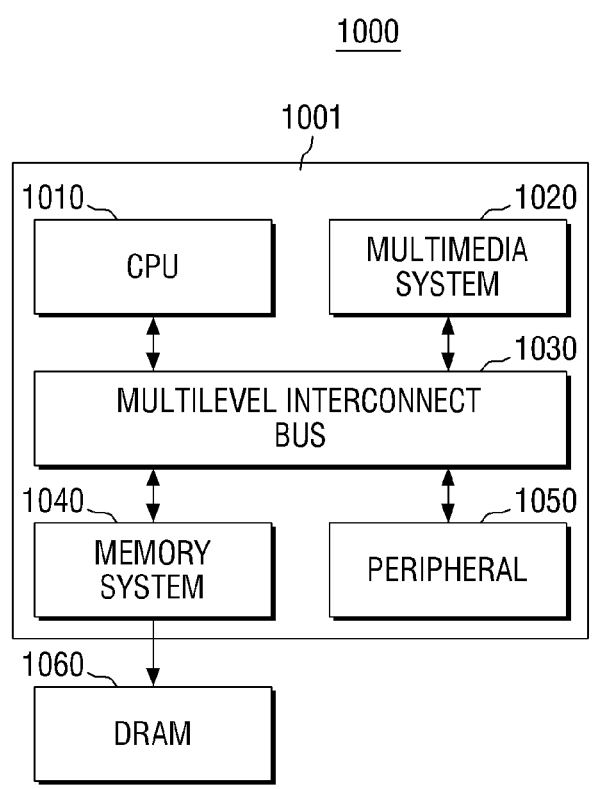
FIG. 9 is a block diagram of a system-on-chip (SoC) system including semiconductor circuits according to embodiments of the inventive concept.

FIG. 9 is a block diagram of a system-on-chip (SoC) system 1000 including one or more semiconductor circuits according to embodiments of the inventive concept.

Referring to FIG. 9, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments of the inventive concept, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The bus 1030 may be used for data communication among the CPU 1010, the multimedia system 1020, the memory system 1040 and the peripheral circuit 1050. In some embodiments of the inventive concept, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as a working memory needed for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may employ any one of the semiconductor circuits according to the above-described embodiments of the inventive concept.

Figure 10:
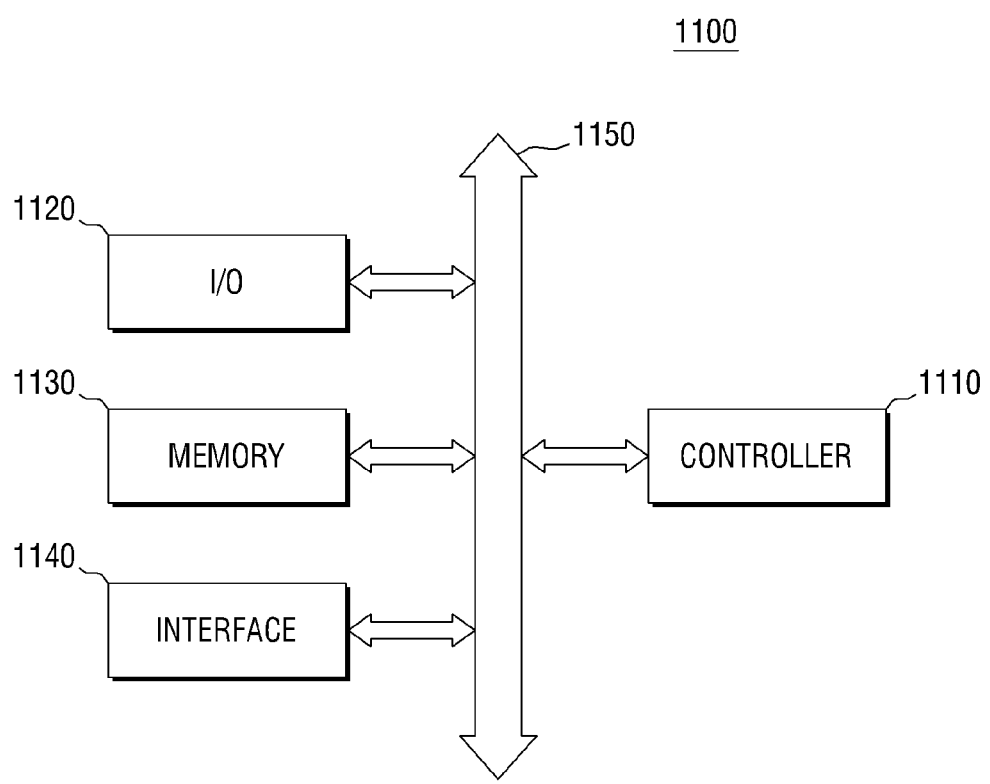
FIG. 10 is a block diagram of an electronic system including semiconductor circuits according to embodiments of the inventive concept.

FIG. 10 is a block diagram of an electronic system 1100 including one or more semiconductor circuits according to embodiments of the inventive concept.

Referring to FIG. 10, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may include a working memory for improving the operation of the controller 1110, and may further include a high-speed DRAM or SRAM.

The electronic system 1100 may be applied to nearly all types of electronic products capable of transmitting and/or receiving information in a wireless environment, such as a personal data assistant (PDA), a portable computer, a web tablet, a wireless phone, a mobile phone, a digital music player, a memory card, etc.

At least one of the elements of the electronic system 1100 may employ any one of the semiconductor circuits according to the above-described embodiments of the inventive concept.

Figure 11:
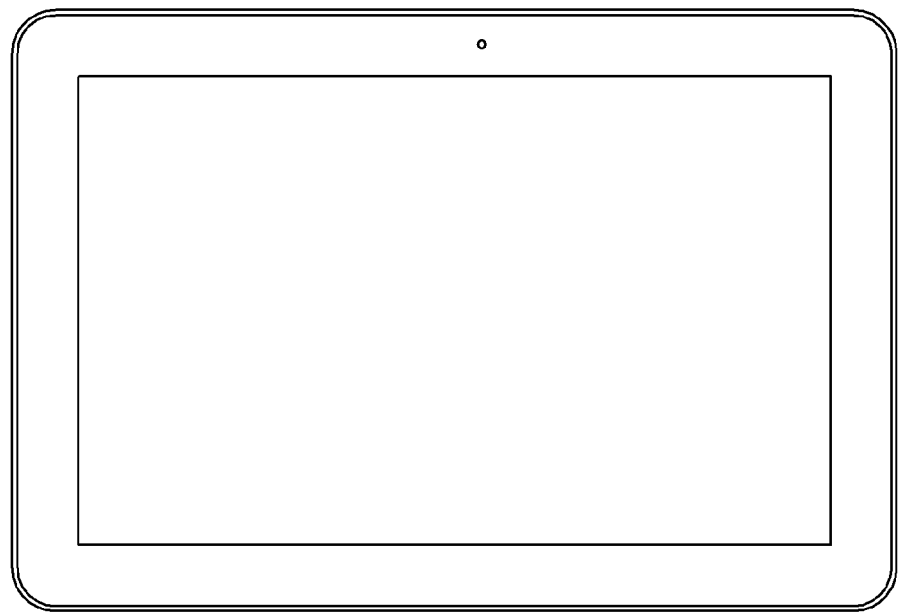
FIGS. 11, 12 and 13 are respective diagrams illustrating systems to which semiconductor circuits according to embodiments of the inventive concept can be applied.
Figure 12:
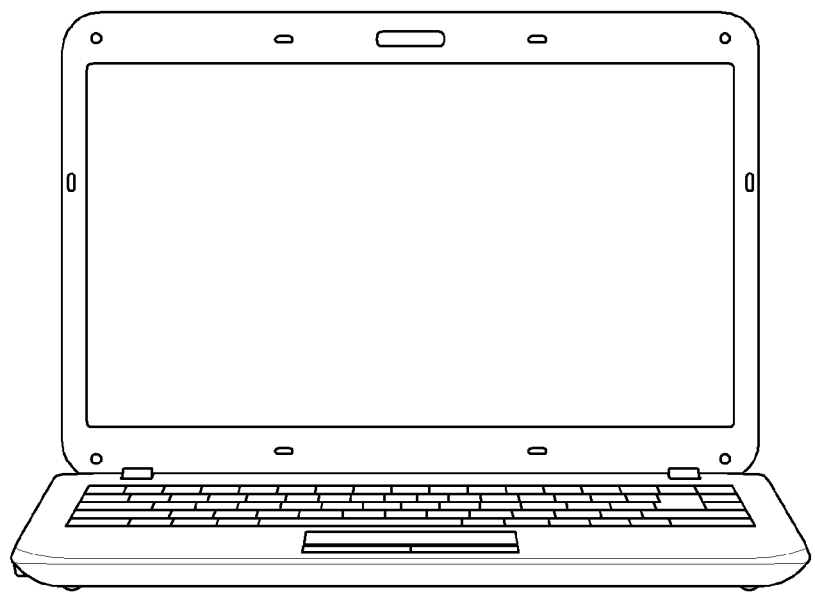
Figure 13:
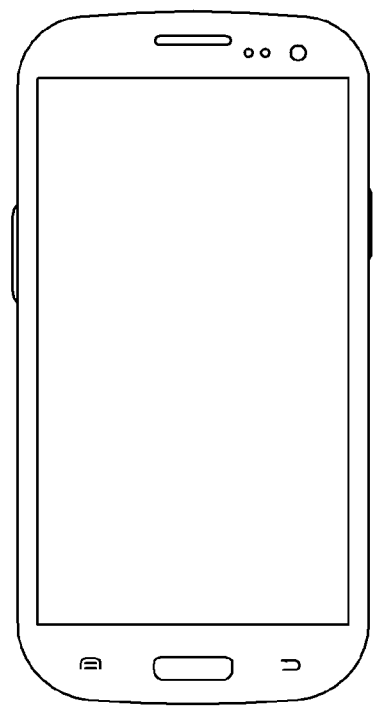

FIGS. 11, 12 and 13 are respective diagrams illustrating various systems that may include one or more semiconductor circuits according to embodiments of the inventive concept can be applied.

FIG. 11 illustrates a tablet personal computer (PC) 1200, FIG. 12 illustrates a notebook computer 1300, and FIG. 13 illustrates a smartphone 1400. At least one of the semiconductor circuits according to the above-described embodiments of the inventive concept, as set forth herein, may be used in the tablet PC 1200, the notebook computer 1300, and the smartphone 1400.

The semiconductor circuits according to the embodiments of the inventive concept, as set forth herein, may also be applied to various integrated circuit (IC) devices other than those set forth herein. That is, while the tablet PC 1200, the notebook computer 1300, and the smartphone 1400 have been described above as examples of a semiconductor system according to an embodiment of the inventive concept, the examples of the semiconductor system according to the embodiment are not limited to the tablet PC 1200, the notebook computer 1300, and the smartphone 1400. In some embodiments of the inventive concept, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While example embodiments have been shown and described above, it will be apparent to those skilled in the art that modifications and variations could be made without departing from the scope of the inventive concept as defined by the appended claims.

What is claimed is:

1. A semiconductor circuit comprising:
a first circuit that determines a voltage of a first node in response to an input data signal and a clock signal;
a first latch that determines a voltage of a second node in response to the voltage of the first node and the clock signal;
a second latch that determines a voltage of a third node in response to the voltage of the second node and the clock signal; and
a second circuit that provides an output data signal as an inverted version of the voltage of the third node in response to the voltage of the third node and the clock signal,
wherein the first circuit comprises:
a first transistor of a first type (P1) connected to a power supply voltage and gated by the input data signal;
a first transistor of a second type (N1) connected between ground and the first node and gated by the input data signal; and
a second transistor of the first type (P2) connected between P1 and the first node and gated by the clock signal to control the output of P1 with respect to the first node; and
the first latch comprises:
a fourth transistor of the first type (P4) gated by the voltage of the first node and pulling up the voltage of the second node;
a fifth transistor of the first type (P5) connected between the power supply voltage and P4 and gated by the clock signal;
a fourth transistor of the second type (N4) connected in series with P4, gated by the voltage of the first node, and pulling down the voltage of the second node; and
a third transistor of the second type (N3) connected between N4 and ground and gated by the clock signal.

2. The semiconductor circuit of claim 1, further comprising:
a first inverter providing an inverted version of the voltage of the first node; and
a second transistor of the second type (N2) connected between the first node and a node between N4 and N3 and gated by the inverted version of the voltage of the first node.

3. The semiconductor circuit of claim 2, wherein the first circuit further comprises:
a third transistor of the first type (P3) connected in parallel with P2 and gated by the voltage of the second node to further control the output of P1 with respect to the first node.

4. The semiconductor circuit of claim 2, wherein the first latch further comprises:
a transistor of the first type connected between P5 and the power supply voltage and gated by a reset signal.

5. The semiconductor circuit of claim 3, further comprising a feedback loop circuit, wherein the feedback loop circuit comprises:

a second inverter connected to the second node and providing an inverted version of the voltage of the second node;
a sixth transistor of the first type (P6) gated by the clock signal to control a connection of the feedback loop circuit to the power supply voltage, and a seventh transistor of the first type (P7) connected in parallel with P6 and gated by the voltage of the first node to further control the connection of the power supply voltage VDD within the feedback loop circuit;
an eighth transistor of the first type (P8) gated by the inverted version of the voltage of the second node to control the output of P6 and P7 with respect to the second node;
a sixth transistor of the second type (N6) gated by the clock signal to control a connection to ground within the feedback loop circuit, and a seventh transistor of the second type (N7) connected in parallel with N6 and gated by the voltage of the first node to further control the connection to ground within the feedback loop circuit; and
a fifth transistor of the second type (N5) gated by the inverted version of the voltage of the second node and connected between P8 and the parallel combination of N6 and N7 to control the output of N6 and N7 with respect to the second node.

6. The semiconductor circuit of claim 4, further comprising a feedback loop circuit, wherein the feedback loop circuit comprises:
a second inverter connected to the second node and providing an inverted version of the voltage of the second node;
a sixth transistor of the first type (P6) gated by the clock signal to control a connection of the feedback loop circuit to the power supply voltage, and a seventh transistor of the first type (P7) connected in parallel with P6 and gated by the voltage of the first node to further control the connection of the power supply voltage VDD within the feedback loop circuit;
an eighth transistor of the first type (P8) gated by the inverted version of the voltage of the second node to control the output of P6 and P7 with respect to the second node;
a sixth transistor of the second type (N6) gated by the clock signal to control a connection to ground within the feedback loop circuit, and a seventh transistor of the second type (N7) connected in parallel with N6 and gated by the voltage of the first node to further control the connection to ground within the feedback loop circuit;
a fifth transistor of the second type (N5) gated by the inverted version of the voltage of the second node and connected between P8 and the parallel combination of N6 and N7 to control the output of N6 and N7 with respect to the second node;
a transistor of the first type connected between the parallel combination of P6 and P7 and the power supply voltage and gated by the reset signal; and
a transistor of the second type connected between the second node and ground and gated by the reset signal.

7. The semiconductor circuit of claim 6, wherein the second latch comprises:
a ninth transistor of the first type (P9) gated by the voltage of the second node to control a connection in the second latch to the power supply voltage;

an eighth transistor of the second type (N8) gated by the voltage of the second node to control a connection in the second latch to ground;

a ninth transistor of the second type (N9) controlling the output of N8 with respect to the third node and gated by the inverted version of the voltage of the first node; and a tenth transistor of the second type (N10) gated by the clock signal to control the output of N9 with respect to the third node.

8. The semiconductor circuit of claim 5, wherein the second latch comprises:

a ninth transistor of the first type (P9) gated by the voltage of the second node to control a connection in the second latch to the power supply voltage;

an eighth transistor of the second type (N8) gated by the voltage of the second node to control a connection in the second latch to ground;

a ninth transistor of the second type (N9) controlling the output of N8 with respect to the third node and gated by the inverted version of the voltage of the first node; and a tenth transistor of the second type (N10) gated by the clock signal to control the output of N9 with respect to the third node.

9. The semiconductor circuit of claim 8, wherein the second circuit comprises:

a third inverter connected to the third node and providing another inverted version of the voltage of the third node;

an eleventh transistor of the second type (N11) connected between the third node and a node between N8 and N9 and gated by the inverted version of the voltage of the third node;

a tenth transistor of first type (P10) and an eleventh transistor of first type (P11) connected in series between the power supply voltage and the third node, wherein P11 is gated by the another inverted version of the voltage of the third node and P10 is gated by the clock signal;

a twelfth transistor of the first type (P12) and a twelfth transistor of the second type (N12) connected in series between the power supply voltage and ground, wherein P12 and N12 are commonly gated by the voltage of the third node and the output data signal is provided at a node between P12 and N12.

10. The semiconductor circuit of claim 7, wherein the second circuit comprises:

a NOR gate receiving as inputs the voltage of the third node and the reset signal and providing a NOR output;

an eleventh transistor of the second type (N11) connected between the third node and a node between N8 and N9 and gated by the NOR output;

a tenth transistor of the first type (P10) and an eleventh transistor of the first type (P11) connected in series between the power supply voltage and the third node, wherein P11 is gated by the NOR output and P10 is gated by the clock signal;

a twelfth transistor of the first type (P12) and a twelfth transistor of the second type (N12) connected in series between the power supply voltage and ground, wherein P12 and N12 are commonly gated by the voltage of the third node and the output data signal is provided at a node between P12 and N12.

11. A semiconductor circuit comprising:

a first circuit including a first transistor of a first type (P1) gated by an input data signal to control a connection in the first circuit to a power supply voltage, a second transistor of the first type (P2) gated by a clock signal to control the output of P1 with respect to a first node, and a first transistor of a second type (N1) gated by the input data signal to control a connection in the first circuit to ground;

a first latch including a fifth transistor of the first type (P5) gated by the clock signal to control a connection in the first latch to the power supply voltage, a fourth transistor of the first type (P4) gated by a voltage of the first node to control an output of P5 to a second node, a series combination of a third transistor of the second type (N3) and a fourth transistor of the second type (N4) connected between the second node and ground, wherein N3 is gated by the clock signal and N4 is gated by the voltage of the first node to control an output of N3 to the second node;

a second latch including a transistor of the first type gated by a voltage of the second node to control a connection between the power supply voltage and a third node, and a transistor of the second type gated by an inverted version of the voltage of the first node to control a connection between the third node and ground, the second latch configured to provide the voltage of the third node as an inverted version of the voltage of the second node; and a second circuit that outputs an output data signal in response to a voltage level of the third node and the clock signal.

12. The semiconductor circuit of claim 11, wherein the first circuit further comprises:

a third transistor of the first type (P3) connected in parallel with P2 and gated by the voltage of the second node to further control the output of P1 with respect to the first node.

13. The semiconductor circuit of claim 11, further comprising:

a feedback loop circuit including the second node and disposed between an output of the first latch and an input of the second latch, wherein the feedback loop circuit controls a previous voltage level of the second node determined when the clock signal is at a first level and a next voltage level of the second node determined when the clock signal is at a second level, such that the previous voltage level and next voltage level are a same voltage.

14. The semiconductor circuit of claim 13, wherein the feedback loop circuit determines the voltage of the second node based on the clock signal, the voltage of the first node, and the previous voltage level of the second node.

15. The semiconductor circuit of claim 13, further comprising:

a control circuit disposed in at least one of the first circuit, the first latch, the second latch, the second circuit and the feedback loop circuit, wherein the control circuit receives at least one control signal that controls the output of the output data signal by the semiconductor circuit.

16. A semiconductor circuit comprising:

a first circuit that determines a voltage of a first node in response to an input data signal and a clock signal;

a first latch that determines a voltage of a second node in response to the voltage of the first node and the clock signal;

a second latch that determines a voltage of a third node in response to the voltage of the second node and the clock signal, wherein the first latch comprises a first transistor, a second transistor, a third transistor and a fourth transistor, wherein the first transistor is gated by the clock signal to provide a power supply voltage, the second transistor is gated by the voltage level of the first node to control an output of the first transistor with respect to the second node, the third transistor is gated by the clock signal to control a connection to ground, and the fourth transistor is gated by the voltage of the first node to control an output of the third transistor with respect to the second node; and a feedback loop circuit including the second node and disposed between an output of the first latch and an input of the second latch, wherein the feedback loop circuit controls a previous voltage level of the second node determined when the clock signal is at a first voltage level and a next voltage level of the second node determined when the clock signal is at a second voltage level, such that the previous voltage level and next voltage level are a same voltage.

17. The semiconductor circuit of claim 16, wherein the first circuit discharges the first node when the input data signal is a third voltage level and pre-charges the first node when the input data signal is a fourth voltage level different from the third voltage level.

18. The semiconductor circuit of claim 17, wherein upon discharge of the first node, the first latch maintains the previous voltage level of the second node when the clock signal is the first voltage level and pre-charges the second node when the clock signal is the second voltage level different from the first voltage level.

19. The semiconductor circuit of claim 17, wherein upon pre-charge of the first node, the first latch discharges the second node when the clock signal is the first voltage level and maintains the previous voltage level of the second node when the clock signal is the second voltage level different from the first voltage level.

20. The semiconductor circuit of claim 17, further comprising a second circuit that provides an output data signal in response to the voltage of the third node and the clock signal, wherein in response to the input data signal having the third voltage level, the second circuit discharges the third node, and in response to the input data signal having the fourth voltage level different from the third voltage level, the second circuit pre-charges the third node.

21. The semiconductor circuit of claim 16, wherein the first and second transistors are P-channel metal oxide semiconductor (PMOS) transistors, and the third and fourth transistors are N-channel metal oxide semiconductor (NMOS) transistors.

* * * * *